United States Patent [19]

Tomita

[11] Patent Number: 5,603,114
[45] Date of Patent: Feb. 11, 1997

[54] DISTORTIONLESS RECEIVING CIRCUIT

[75] Inventor: Hiroki Tomita, Tokyo, Japan

[73] Assignee: NEC Corporation, Tokyo, Japan

[21] Appl. No.: 332,042

[22] Filed: Nov. 1, 1994

[30] Foreign Application Priority Data

Dec. 3, 1993 [JP] Japan ..................... 5-304203

[51] Int. Cl.⁶ ................. H04B 1/10; H04B 1/16
[52] U.S. Cl. ................. 455/249.1; 455/250.1; 455/254
[58] Field of Search .............. 455/232.1, 234.1, 455/234.2, 239.1, 240.1, 242.2, 247.1, 249.1, 250.1, 253.2, 254, 295, 296, 311, 280, 289, 291, 293; 375/345; 333/81 R, 81 A; 327/306, 314, 320, 325, 326, 503; 330/284; 348/678

[56] References Cited

U.S. PATENT DOCUMENTS 4,553,105  11/1985  Sasaki ..................... 330/284
5,321,849  6/1994  Lemson ..................... 455/249.1

FOREIGN PATENT DOCUMENTS 58-194414  11/1983  Japan .
0025308   2/1986   Japan ..................... 455/249.1
0055428   2/1990   Japan ..................... 455/249.1
5347567   12/1993  Japan ..................... 455/254

*Primary Examiner*—Andrew Faile
*Assistant Examiner*—Nguyen Vo
*Attorney, Agent, or Firm*—Foley & Lardner

[57] ABSTRACT

A distortionless receiving circuit used in a radio receiver to reduce degradation of the receiving sensitivity in case of a relatively lower receiving electric field. The circuit has a radio frequency amplifier, a mixer for frequency conversion, a variable attenuator interposed between the radio frequency amplifier and the mixer, an intermediate frequency amplifier disposed on the output side of the mixer, a detector and a control block. The control block generates a control signal in accordance with the intensity of the output signal of the intermeddle frequency amplifier. The attenuation amount of the variable attenuator is controlled by the control signal in a stepwise manner.

4 Claims, 4 Drawing Sheets

RECEIVING ELECTRIC FIELED LEVEL

ATTENUATION-AMOUNT SWITCHING SIGNAL

CONTROL VOLTAGE

LEVEL DETECTION VOLTAGE SIGNAL

DISTORTIONLESS RECEIVING CIRCUIT

BACKGROUND OF THE INVENTION

1. Field of the Invention

The present invention relates to a distortionless receiving circuit used for a radio receiver, and more particularly to a distortionless receiving circuit which can suppress the generation of signal distortions based on frequency signal inputs received.

2. Description of the Related Arts

When a comparatively larger reception signal in electric field strength is inputted to a radio receiver, excessive signal voltages will be applied to the internal circuits of the receiver, thereby causing the occurrence of distortions. Distortionless receiving circuits have conventionally been used to suppress the generation of such distortions. The distortionless receiving circuits are typically constructed by a variable attenuator controlled in dependence on the intensity of reception signals. For example, a superheterodyne-type radio receiver utilizing a distortionless receiving circuit is disclosed in Japanese Patent Laid-open No. 194414/83 (JP, A, 58-194414).

FIG. 1 illustrates the radio receiver disclosed in the Laid-open No. 194414/83 document. Located between an antenna 11 and a radio frequency (RF) amplifier 13 is a variable attenuator 12 which comprises a group of resistors arranged in a ladder manner, and is disposed to be controlled using open-collector outputs of an A/D converter 22. A mixer 14 is so connected on the output side of the high frequency amplifier 13 that it can achieve the frequency mixing of the local oscillation output signals from a local oscillator (LO) 15 and the output signals from the radio frequency amplifier 13. On the output side of the mixer 14, there are disposed a bandpass filter 16, an intermediate frequency (IF) amplifier 17, a detector 18, and a low frequency (LF) amplifier 19 in this order, and a speaker 20 is connected to the output terminal of the low frequency amplifier 19. In addition, a carrier rectifier 21 is also disposed in such a manner that it receives the carriers taken out at the detector 18. The output of the carrier rectifier 21 is applied to the A/D converter 22 on one hand, and applied as AGC (Automatic Gain Control) signal to the radio frequency amplifier 13 and the intermediate frequency amplifier 17 on the other hand.

In operation, the reception signals from the antenna 11 pass through the variable attenuator 12 and are then amplified at the radio frequency amplifier 13. The output of the amplifier 13 is subject to frequency conversion at the mixer 14 and then so processed at the bandpass filter 16 that only intermediate frequency components will be extracted. The intermediate frequency components, after having been amplified at the intermediate frequency amplifier 17, are detected at the detector 18 and converted into low frequency signals. Consequently, the speaker 30 is driven with the low frequency signals from the low frequency amplifier 19. In addition, the carrier components taken out at the wave detector 18 are converted into dc signals at the carrier rectifier 21 to operate the A/D converter 22 in compliance with the voltages of dc signal, thereby allowing the amount of attenuation in the variable attenuator 12 to be determined. Moreover, the dc signals are also used to decide the amount of AGC in the radio frequency amplifier 13 and the intermediate frequency amplifier 17. Finally, the gain control for the variable attenuator 12 will be carried out stepwise in compliance with the magnitude of the carrier components in the frequency signals received, and the gain control for the minor variations in the intensity of receiving electric field will be effected through the radio frequency amplifier 13 and the intermediate frequency amplifier 17.

However, this type of radio receiver involves such a problem that NF (Noise Figure) values may be aggravated due to the passage loss through the variable attenuator, thus resulting in the degradation in reception sensitivity.

It is therefore an object of the present invention to provide a distortionless receiving circuit that, in the case of high electric field strength, can prevent the generation of distortions without causing the reception sensitivity in the case of lower electric field strength to be degraded.

SUMMARY OF THE INVENTION

The aforesaid object of the present invention will be accomplished by a distortionless receiving circuit for a radio receiver, comprising radio frequency amplification means for amplifying radio frequency reception signals and outputting them as a first signal, variable attenuation means for receiving the first signal, providing a certain amount of attenuation in compliance with a control voltage to the high frequency signals, and outputting it as an output signal thereof, frequency conversion means for converting the output signal from the variable attenuation means into a second signal of intermediate frequencies and outputting it as the output thereof, intermediate frequency amplification means for amplifying the second signal, and outputting it as a third signal, detection means for detecting the third signal, outputting a detected signal, and also outputting level detection signals corresponding to the intensity of the third signal, and control means for generating the control voltage in compliance with the level detection signal.

The above and other objects, features and advantages of the present invention will become apparent from the following description referring to the accompanying drawings which illustrate an example of a preferred embodiment of the present invention.

DETAILED DESCRIPTION OF THE PREFERRED EMBODIMENTS

Figure 1:
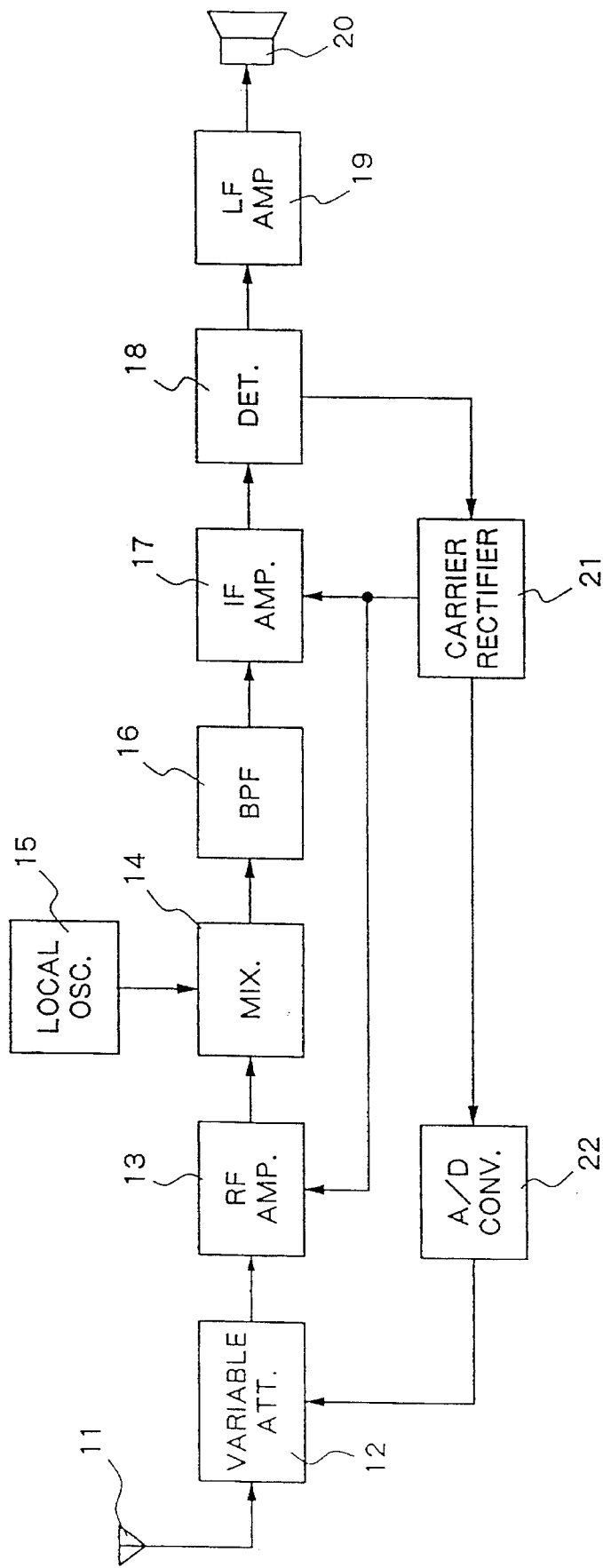
FIG. 1 is a block diagram showing one example of the construction of a radio receiver using a conventional distortionless receiving circuit.
Figure 2:
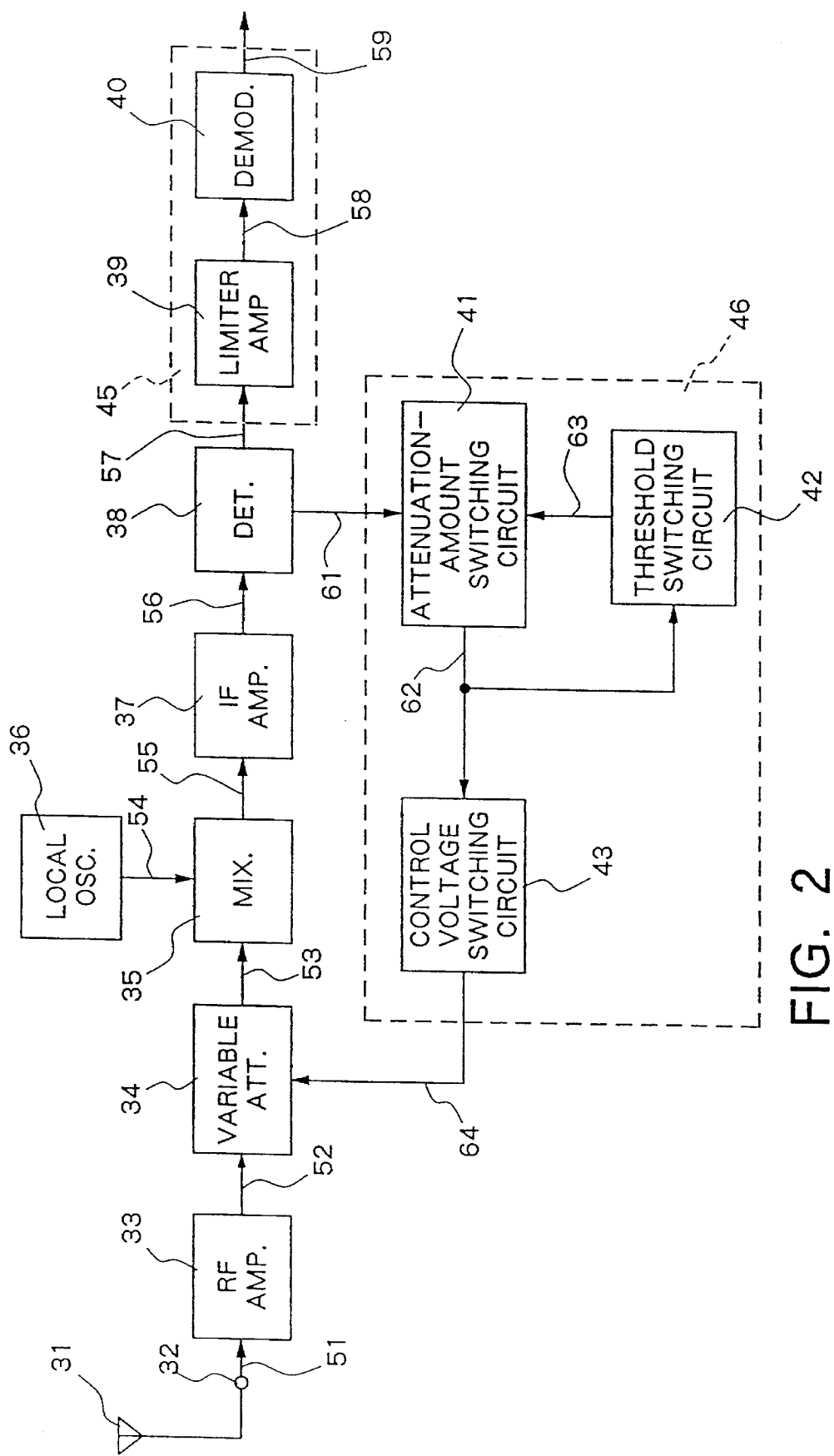
FIG. 2 is a block diagram illustrating a construction of a distortionless receiver according to a preferred embodiment of the present invention.

The radio receiver shown in FIG. 2 illustrates a receiver which is constructed by applying the distortionless receiving circuit according to the present invention and can be used in data communication.

As seen from FIG. 2, an antenna 31 is connected to the input side of a radio frequency amplifier 33 via an input terminal 32. On the output side of the radio frequency amplifier 33, a mixer 35 which can perform frequency conversion is connected through a variable attenuator 34. The mixer 35 is further connected to a local oscillator 36 which outputs a local oscillation output signal 54, and on the output side of the mixer 35 are connected, in series, an intermediate frequency amplifier 37, a wave detector 38, a limiter amplifier 39 and a demodulator 40 in this order. The limiter amplifier 39 and the demodulator 40 constitute a demodulation block 45. In this arrangement, the wave detector 38 is constructed so as to not only detect the intermediate frequency signal 56 from the intermediate frequency amplifier 37 and output it to the demodulation block 45 as detected signal 57, but also detect the intensity of the intermediate frequency signal 56 and output a level detection voltage signal 61. As will become more evident from the explanation below, the level detection voltage signal 61 is a signal whose magnitude is determined depending on the intensity of receiving electric field at the antenna 31 and the amount of attenuation in the variable attenuator 34.

An attenuation-amount switching circuit 41 receives, as input, the level detection voltage signal 61 and produces an attenuation-amount switching signal 62 used for switching the amount of attenuation at the variable attenuator 34 in two steps, in compliance with the level detection voltage signal 61. The attenuation-amount switching signal 62 is a binary signal consisting of low level and high level, and is outputted to a threshold switching circuit 42 and to a control voltage switching circuit 43. More concretely, the attenuation-amount switching circuit 41 compares the level detection voltage signal 61 with the threshold signal 63 coming from the threshold switching circuit 42 to be described later, and outputs the attenuation-amount switching signal 62 having either a low or high level selected according to the result of comparison. Such attenuation-amount switching circuit 41 can be constructed by using at least a comparator, for example. In this embodiment, the attenuation-amount switching signal 62 having a low level corresponds to a smaller amount of attenuation and the high level signal corresponds to a larger amount of attenuation. The attenuation-amount switching circuit 41, the threshold switching circuit 42 and the control voltage switching circuit 43 constitute a control block 46.

The threshold switching circuit 42 outputs the threshold signal 63 for providing hysteresis to the relationship between the receiving electric field intensity and the amount of attenuation in the variable attenuator. The threshold signal 63 is a signal to be switched in two steps. If the current attenuation-amount switching signal 62 is low, the relatively larger threshold signal 63 is outputted, and if the current attenuation switching signal is high, the relatively smaller threshold signal 63 is outputted.

The control voltage switching circuit 43 provides to the variable attenuator 34 a control voltage signal 64 having either one of two control voltages ($V_H$, $V_L$) depending on the values of the attenuation-amount switching signal 62. In this embodiment, if the attenuation-amount switching signal 62 is low, the relatively lesser control voltage $V_L$ is to be provided.

Figure 3:
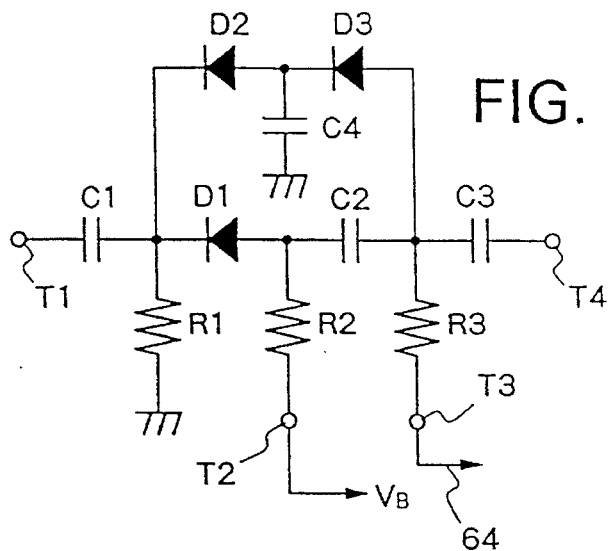
FIG. 3 is a circuit diagram showing an illustrative construction of a variable attenuator utilizing PIN diodes.

The construction of the variable attenuator 34 will be explained in detail by referring to FIG. 3. So far as the type is concerned, the variable attenuator according to the present invention is not limited to any specific form, but any type of attenuator may be used so long as the amount of attenuation thereof can be varied with a control voltage. In practice, it is desirable to employ the variable attenuator using PIN diodes. As well known to those skilled in the art, the PIN-diode-type variable attenuator utilizes the properties that the impedance of a PIN diode varies largely depending on the magnitude of a forward bias current. The variable attenuator 34 shown in FIG. 3 is of well known type referred to as fixed impedance type and comprises three PIN diodes D1 to D3, three resistors R1 to R3, four capacitors C1 to C4 and four terminals T1 to T4. PIN diode D1 operates as parallel type attenuator and PIN diode D2 operates as series type attenuator. A terminal T1 on the capacitor C1 side is an input terminal which receives a radio frequency signal 52 from the radio frequency amplifier 33, while the terminal T4 on the capacitor C3 side is an output terminal which is connected to the mixer 35. Terminals T2 and T3 are control terminals, of which the terminal T2 is provided with a bias supply voltage $V_B$, and the terminal T3 receives the control voltage signal 64 from the control signal switching circuit 43. In the variable attenuator 34, when the control voltage signal 64 having the relatively higher voltage $V_H$ is applied to the terminal T3, the larger amount of attenuation will become available.

Next, the operation of this receiver will be explained.

The radio frequency reception signal 51 inputted from the antenna 31 is amplified and band-limited at the radio frequency amplifier 33 and then outputted as radio frequency signal 52. The radio frequency signal 52, after having passed through the variable attenuator 34, is inputted as radio frequency signal 53 to the mixer 35. In the mixer 35, the radio frequency signal 53 is mixed with the local oscillation signal 54 coming from the frequency oscillator 36 and then converted into the intermediate frequency signal 55. This intermediate frequency signal 55 is band-limited and amplified at the intermediate frequency amplifier 37 and then applied as intermediate frequency signal 56 to the detector 38. The detector 38 detects the intermediate frequency signal 56 to obtain the detected signal 57 and produces the level detection voltage signal 61 proportional to the intensity of the intermediate frequency signal 56, and the detected signal 57 is supplied to the limiter amplifier 39. The detected signal 57 is amplified at the limiter amplifier 39 up to a given width of voltage to obtain the signal 58 which is to be demodulated at the demodulator 40. The output of the demodulator 40 is to be processed as a reception data signal 59. On the other hand, the level detection voltage signal 61 inputted into the attenuation-amount switching circuit 41 is, as will be described later, used for the control of the variable attenuator 34. Next, the control operation for the amount of attenuation will be explained in conjunction with FIG. 4.

Assume that the level of the receiving electric field for the radio frequency signal 51 changes as shown in (A) of FIG. 4. Changes in the attenuation-amount switching signal 62, the control voltage and the level detection voltage signal 61 according to the change of the receiving electric field level are shown in (B), (C) and (D) of FIG. 4, respectively.

At time $t_0$, the level of attenuation-amount switching signal 62 stays low, and the control voltage $V_L$ that makes the amount of attenuation minimum is being supplied from the control voltage switching circuit 43 to the variable attenuator 34. Under these conditions, the threshold outputted as threshold signal 63 from the threshold switching circuit 42 to the attenuation-amount switching circuit 41 is set to a predetermined voltage value <a>. The value <a> corresponds to the value of the level detection voltage signal obtained under the condition that the receiving electric field at the antenna end is at a level of A and that the amount of attenuation in the variable attenuator 34 is at a minimum.

Herein, it is assumed that the receiving electric field has increased in level while the time $t_1$ has elapsed. Immediately thereafter, since the level detection voltage signal 61 becomes larger than the threshold <a> indicated by the threshold signal 63, the level of the attenuation-amount switching signal 62 outputted from the attenuation-amount switching circuit 41 goes high. With the attenuation-amount switching signal 62 high, the voltage of the control voltage signal 64 supplied from the control voltage switching circuit 43 becomes voltage $V_H$, and the amount of attenuation in the variable attenuator 34 increases. Simultaneously with this, the threshold in the threshold switching circuit 42 will be switched from value <a> to value <b>. The predetermined threshold value <b> is set to the voltage value corresponding to the value of the level detection voltage signal 61 obtained under the condition that the receiving electric field at the antenna end is at the level of B and that the amount of attenuation in the variable attenuator 34 has increased. Here, The incident electric field B is presumed to be smaller in level than the electric field A.

Herein, let it be assumed that the receiving electric field has decreased in level while the time $t_2$ has elapsed. Immediately after time $t_2$, the level of the level detection voltage signal 61 becomes less than the threshold <b> indicated by the threshold signal 63, so that the attenuation-amount switching signal 62 shifts to low level. As the result, the control voltage signal 64 outputted from the control voltage switching circuit 43 becomes voltage $V_L$, thus making the amount of attenuation in the variable attenuator minimum, again. Simultaneously with this, the threshold of the threshold switching circuit 42 becomes the value <a>, and returns to the same state as the initial condition.

As the amount of attenuation in the variable attenuator 34 is controlled as explained above, the level detection voltage signal 61 changes as shown in (D) of FIG. 4. Since the level detection voltage signal 61 is proportional to the intensity of the signal applied to respective stages located on and after the mixer 35, it can be seen from the diagram that the variations in the intensity of the signal applied to each stage are suppressed as compared with the variations in the level of receiving electric field. The present invention stands on the fact that the cause of the distortions which occur at the time when the level of the receiving electric field is high resides in the mixer, and the amplifier and filter at the intermediate frequency stage, rather than the radio frequency amplifier. That is, in the present invention, the occurrence of undesirable distortions is suppressed by avoiding the entry of an excessively large signal into any stage located on and after the mixer.

It should be noted that a distortionless receiving circuit can be made according to the present invention which is free of any degradation in sensitivity. Take into account three types of receivers shown in FIGS. 5A, 5B and 5C. In the case of the receiver shown in FIG. 5A, an antenna terminal 70, a high frequency amplifier 71 and a mixer 73 are all directly connected. In a conventional receiver denoted in FIG. 5B, a variable attenuator 72 is inserted between the antenna terminal 70 and the radio frequency amplifier 71. In the receiver arrangement based on the present invention illustrated in FIG. 5C, the variable attenuator 72 is inserted between the radio frequency amplifier 71 and the mixer 73. In all the receiver arrangements described above, it is assumed that the gain of the radio frequency amplifier be 18 dB, NF be 3 dB and NF on and after the mixer 73 be 10 dB. It is presumed that the amount of attenuation in the variable attenuator 72 be 2 dB at minimum and 12 dB at maximum.

Figure 5A:
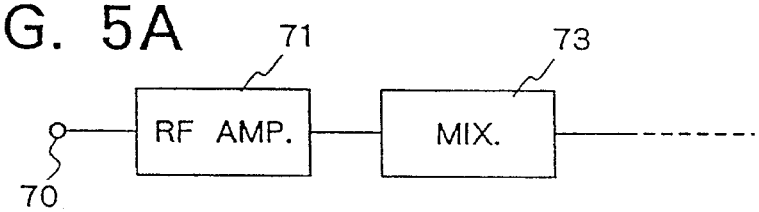
FIGS. 5A to 5C are block diagrams each illustrating the front end portion of the receiver.
Figure 5B:
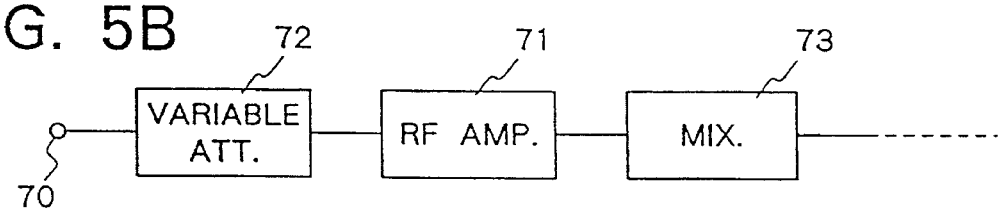

In the receiver shown in FIG. 5A, the NF observed from the antenna terminal 70 side is 3.30 dB. In the conventional receiver shown in FIG. 5B, the NF becomes 5.30 dB at the time when the amount of attenuation in the variable attenuator 72 is at a minimum (2 dB), and the decrease in the strength of the receiving electric field causes aggravation of the NF, thus resulting in the degradation of reception sensitivity.

Figure 5C:
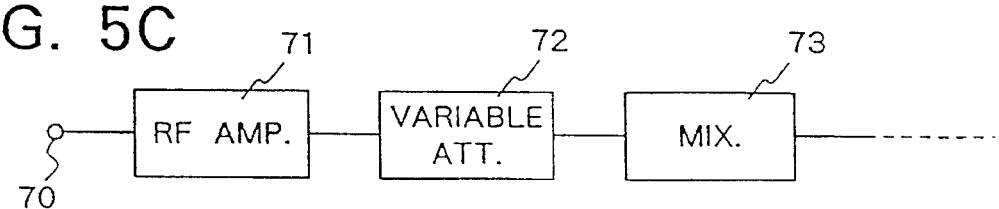
Figure 4A:
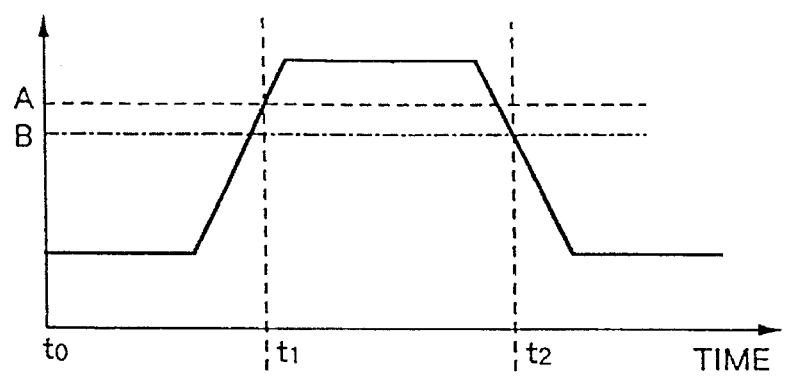
FIG. 4 is a timing chart explaining the operation of the receiver shown in FIG. 2.
Figure 4B:
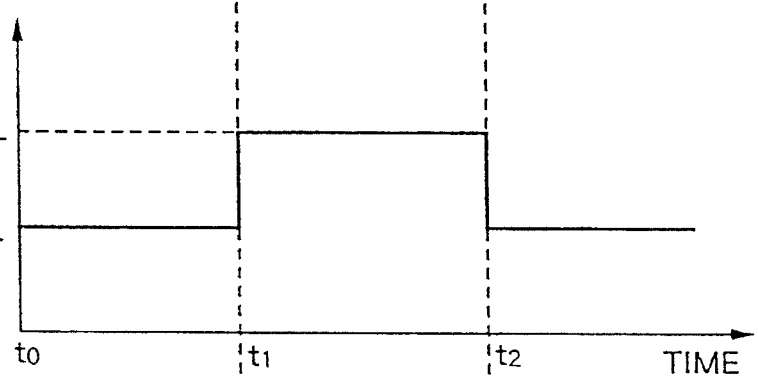
Figure 4C:
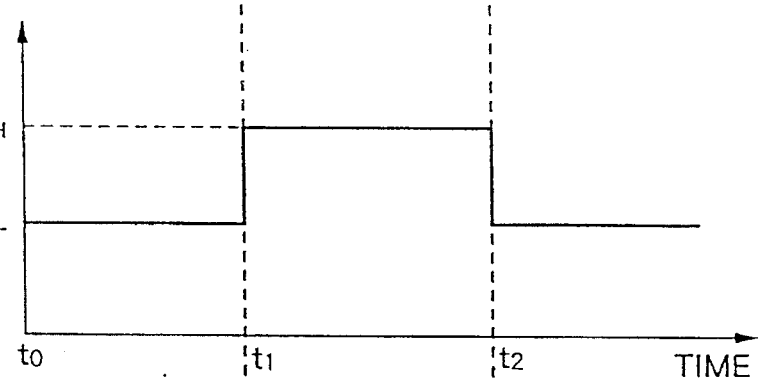
Figure 4D:
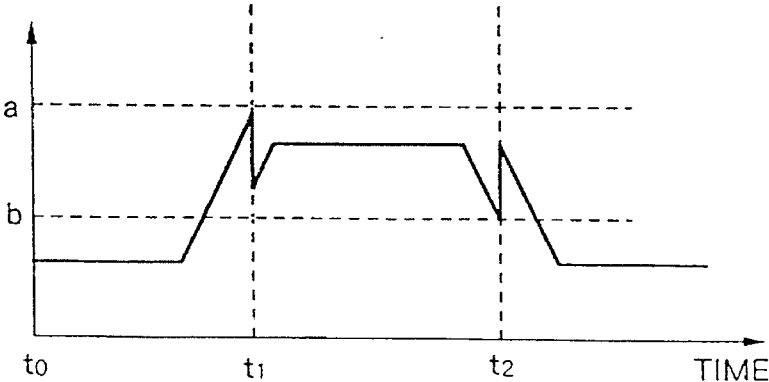

On the contrary, in the case of the receiver shown in FIG. 5C according to the present invention, the NF observed from the antenna terminal 70 side at the time when the amount of the attenuation in the variable attenuator 72 is at a minimum is equal to 3.47 dB, and the degradation of the NF due to the insertion of the variable attenuator 72 is negligible. Accordingly, no degradation of reception sensitivity will result. In case where the level of the receiving electric field is high and the amount of attenuation in the variable attenuator 72 is at a maximum (12 dB), the NF may deteriorate to 6.53 dB, but the CN ratio (carrier/noise ratio) at the high electric field level will be maintained in sufficiently good condition, so that no influence on the demodulation due to aggravation of the NF will result. Conversely, as the level of the signals are lowered by the variable attenuator, the distortion inevitably developed at the stage on and after the mixer 73 will be reduced accordingly, so that more correct demodulation will become possible.

It is to be understood that variations and modifications of a distortionless receiving circuit disclosed herein will be evident to those skilled in the art. It is intended that all such modifications and variations be included within the scope of the appended claims.

What is claimed is:

1. A distortionless receiving circuit for radio receivers, comprising:

radio frequency amplification means for amplifying a radio frequency reception signal and outputting it as a first signal;

variable attenuation means for receiving as input said first signal, providing said first signal with a certain amount of attenuation corresponding to a control voltage and outputting it as an output signal thereof;

frequency conversion means for converting said output signal of said variable attenuation means into a second signal of intermediate frequency and outputting it as an output thereof;

intermediate frequency amplification means for amplifying said second signal and outputting it as a third signal;

wave detection means for detecting said third signal, outputting a detected signal, and also outputting a level detection signal corresponding to an intensity of said third signal; and control means for generating said control voltage in accordance with said level detection signal;

wherein said control means is adapted to generate, in a selective switching relationship, one of a first control voltage corresponding to a relatively smaller amount of attenuation in said variable attenuation means and a second control voltage corresponding to a relatively larger amount of attenuation;

wherein said control voltage is switched to said second control voltage when said level detection signal increases and exceeds a first threshold, and to said first control voltage when said level detection signal decreases below a second threshold, and wherein said first threshold is larger than said second threshold; and wherein said first threshold is determined in accordance with said level detection signal obtained at a time when a receiving electric field reaches a predetermined first level under a state of said relatively smaller amount of attenuation, said second threshold is determined in accordance with said level detection signal obtained at a time when said receiving electric field has reached a predetermined second level under a state of said relatively larger amount of attenuation, and wherein said predetermined first level is larger in value than said predetermined second level.

2. The distortionless receiving circuit set forth in claim 1, wherein said variable attenuation means comprises a PIN diode, and said amount of attenuation is controlled by varying a bias current flowing through said PIN diode in accordance with said control voltage.

3. A distortionless receiving circuit for radio receivers, comprising:

radio frequency amplification means for amplifying a radio frequency reception signal and outputting it as a first signal;

variable attenuation means for receiving as input said first signal, providing said first signal with a certain amount of attenuation corresponding to a control voltage and outputting it as an output signal thereof;

frequency conversion means for converting said output signal of said variable attenuation means into a second signal of intermediate frequency and outputting it as an output thereof;

intermediate frequency amplification means for amplifying said second signal and outputting it as a third signal;

wave detection means for detecting said third signal, outputting a detected signal, and also outputting a level detection signal corresponding to an intensity of said third signal; and control means for generating said control voltage in accordance with said level detection signal;

wherein said control means comprises:

threshold switching means for receiving, as input, an attenuation amount switching signal, switching the threshold according to said attenuation-amount switching signal, and outputting a threshold signal;

attenuation-amount switching control means for comparing said level detection signal with said threshold signal and outputting said attenuation-amount switching signal; and a control voltage switching means for switching said control voltage according to said attenuation-amount switching signal and outputting said control voltage as the output thereof.

4. The distortionless receiving circuit set forth in claim 3, wherein said variable attenuation means comprises a PIN diode, and said amount of attenuation is controlled by varying a bias current flowing through said PIN diode in accordance with said control voltage.

* * * * *